(12) United States Patent
Chen

(10) Patent No.: US 6,197,181 B1
(45) Date of Patent: Mar. 6, 2001

(54) APPARATUS AND METHOD FOR ELECTROLYTICALLY DEPOSITING A METAL ON A MICROELECTRONIC WORKPIECE

(75) Inventor: LinLin Chen, Kalispell, MT (US)

(73) Assignee: Semitool, Inc., Kalispell, Inc., MT (US)

( * ) Notice: Subject to any disclaimer, the term of this patent is extended or adjusted under 35 U.S.C. 154(b) by 0 days.

(21) Appl. No.: 09/045,245

(22) Filed: Mar. 20, 1998

(51) Int. Cl.$^7$ .................... C25D 5/02; H01L 21/288; H01L 21/445
(52) U.S. Cl. ............... 205/123; 205/183; 205/184; 205/186; 205/295; 204/198
(58) Field of Search ..................... 205/295, 183, 205/184, 186, 123; 204/198

(56) References Cited

U.S. PATENT DOCUMENTS

| | | |
|---|---|---|
| 3,664,933 | 5/1972 | Clauss . |
| 3,878,066 | 4/1975 | Dettke et al. . |
| 4,000,046 | 12/1976 | Weaver . |
| 4,134,802 | 1/1979 | Herr . |
| 4,576,689 * | 3/1986 | Makkaev et al. ............. 205/159 |
| 5,151,168 * | 9/1992 | Gilton et al. ............... 205/123 |
| 5,549,808 * | 8/1996 | Farooq et al. .............. 205/123 |
| 5,882,498 * | 3/1999 | Dubin et al. ............... 205/261 |
| 5,908,543 | 6/1999 | Matsunami et al. . |
| 5,932,077 | 8/1999 | Reynolds . |

* cited by examiner

Primary Examiner—Kathryn Gorgos
Assistant Examiner—Wesby A. Nicoles
(74) Attorney, Agent, or Firm—Christensen O'Connor Johnson Kindness PLLC

(57) ABSTRACT

A process for applying a metallization interconnect structure to a semiconductor workpiece having a barrier layer deposited on a surface thereof is set forth. The process includes the forming of an ultra-thin metal seed layer on the barrier layer. The ultra-thin seed layer having a thickness of less than or equal to about 500 Angstroms. The ultra-thin seed layer is then enhanced by depositing additional metal thereon to provide an enhanced seed layer. The enhanced seed layer has a thickness at all points on sidewalls of substantially all recessed features distributed within the workpiece that is equal to or greater than about 10% of the nominal seed layer thickness over an exteriorly disposed surface of the workpiece.

64 Claims, 10 Drawing Sheets

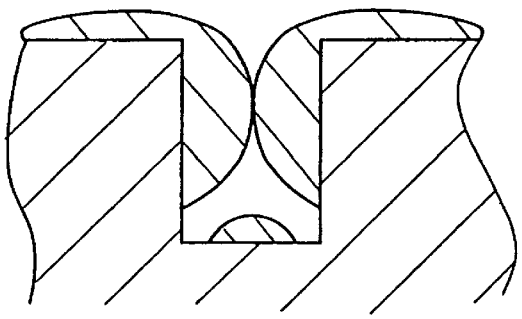
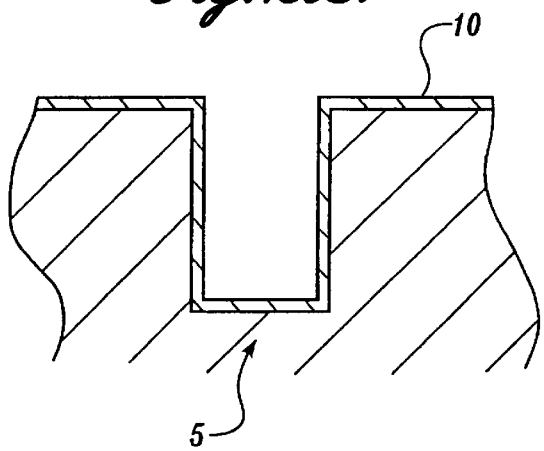
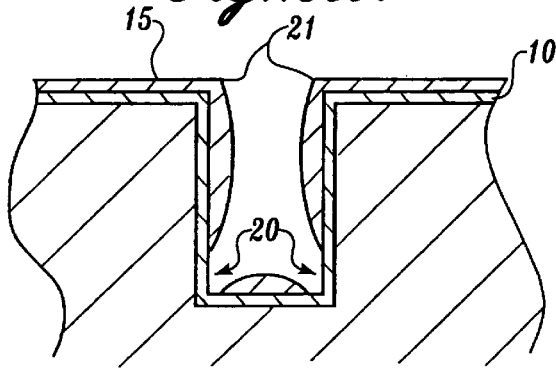
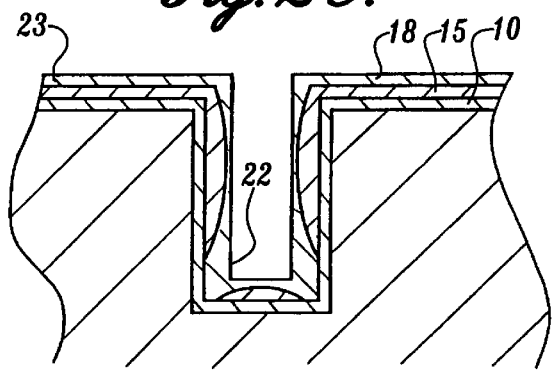
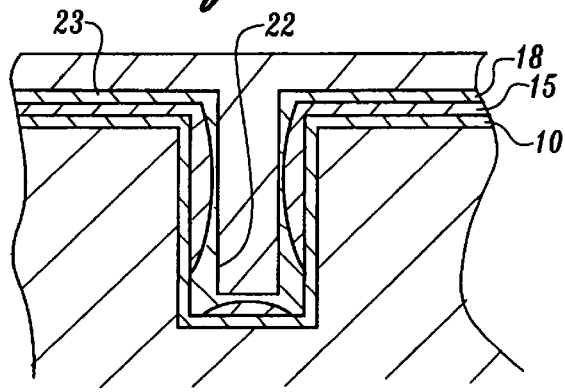
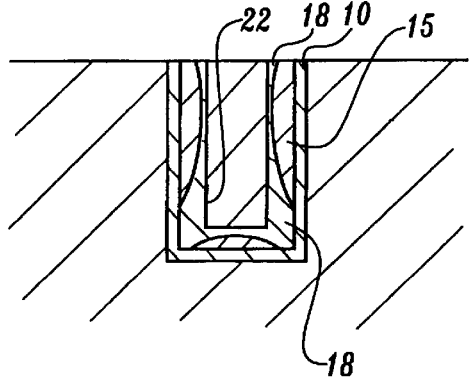

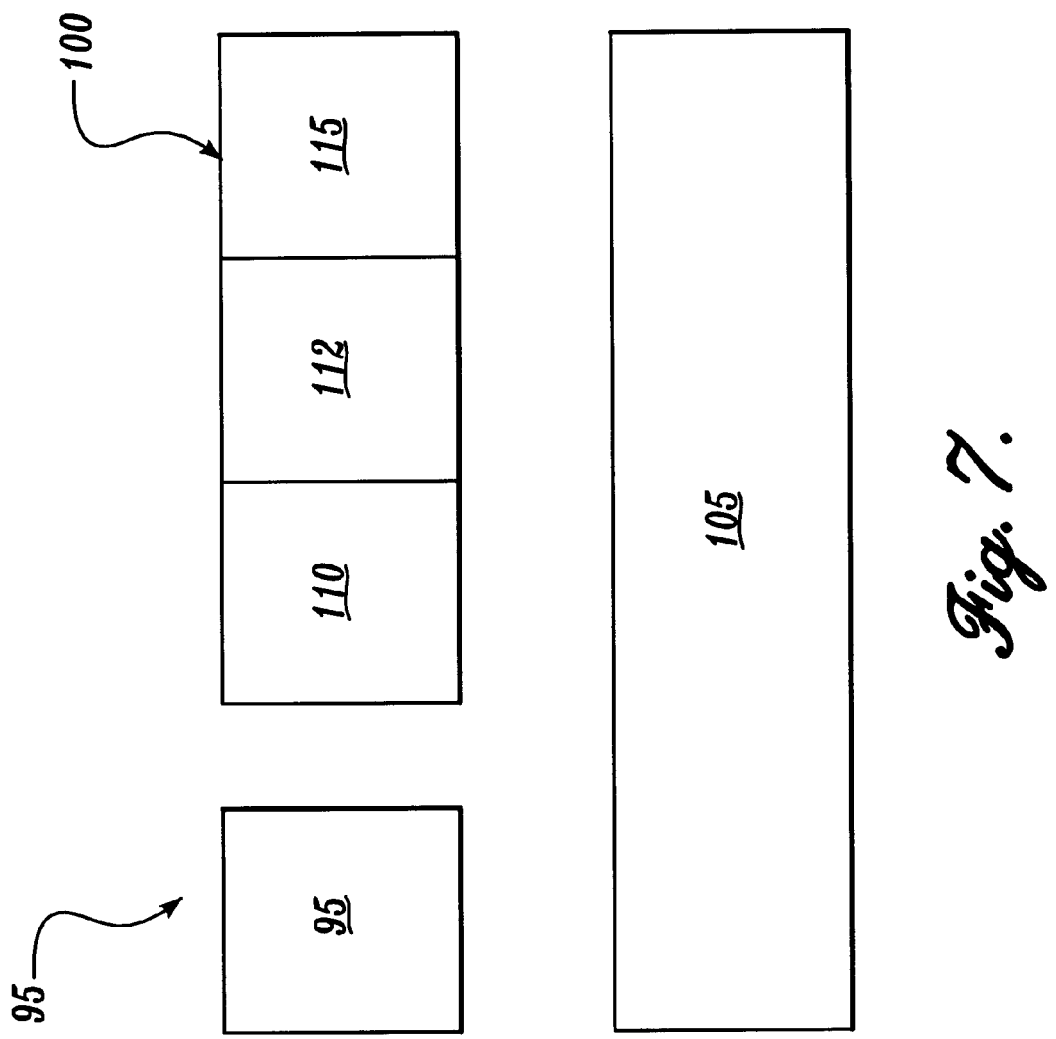

APPARATUS AND METHOD FOR ELECTROLYTICALLY DEPOSITING A METAL ON A MICROELECTRONIC WORKPIECE

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

An integrated circuit is an interconnected ensemble of devices formed within a semiconductor material and within a dielectric material that overlies a surface of the semiconductor. Devices which may be formed within the semiconductor include MOS transistors, bipolar transistors, diodes and diffused resistors. Devices which may be formed within the dielectric include thin-film resistors and capacitors. Typically, more than 100 integrated circuit die (IC chips) are constructed on a single 8 inch diameter silicon wafer. The devices utilized in each dice are interconnected by conductor paths formed within the dielectric. Typically, two or more levels of conductor paths, with successive levels separated by a dielectric layer, are employed as interconnections. In current practice, an aluminum alloy and silicon oxide are typically used for, respectively, the conductor and dielectric.

Delays in propagation of electrical signals between devices on a single die limit the performance of integrated circuits. More particularly, these delays limit the speed at which an integrated circuit may process these electrical signals. Larger propagation delays reduce the speed at which the integrated circuit may process the electrical signals, while smaller propagation delays increase this speed. Accordingly, integrated circuit manufacturers seek ways in which to reduce the propagation delays.

For each interconnect path, signal propagation delay may be characterized by a time delay $\tau$. See E. H. Stevens, *Interconnect Technology*, QMC, Inc., July 1993. An approximate expression for the time delay, $\tau$, as it relates to the transmission of a signal between transistors on an integrated circuit is given below.

$$\tau = RC[1+(V_{sat}/RI_{SAT})]$$

In this equation, R and C are, respectively, an equivalent resistance and capacitance for the interconnect path and $I_{SAT}$ and $V_{SAT}$ are, respectively, the saturation (maximum) current and the drain-to-source potential at the onset of current saturation for the transistor that applies a signal to the interconnect path. The path resistance is proportional to the resistivity, $\rho$, of the conductor material. The path capacitance is proportional to the relative dielectric permittivity, $K_e$, of the dielectric material. A small value of X requires that the interconnect line carry a current density sufficiently large to make the ratio $V_{sat}/RI_{SAT}$ small. It follows therefore, that a low-$\rho$ conductor which can carry a high current density and a low-$K_e$ dielectric must be utilized in the manufacture of high-performance integrated circuits.

To meet the foregoing criterion, copper interconnect lines within a low-$K_e$ dielectric will likely replace aluminum-alloy lines within a silicon oxide dielectric as the most preferred interconnect structure. See "Copper Goes Mainstream: Low-k to Follow", *Semiconductor International*, November 1997, pp. 67–70. Resistivities of copper films are in the range of 1.7 to 2.0 $\mu\Omega$cm.; resistivities of aluminum-alloy films are in the range of 3.0 to 3.5 $\mu\Omega$cm.

Despite the advantageous properties of copper, it has not been as widely used as an interconnect material as one would expect. This is due, at least in part, to the difficulty of depositing copper metallization and, further, due to the need for the presence of barrier layer materials. The need for a barrier layer arises from the tendency of copper to diffuse into silicon junctions and alter the electrical characteristics of the semiconductor devices formed in the substrate. Barrier layers made of, for example, titanium nitride, tantalum nitride, etc., must be laid over the silicon junctions and any intervening layers prior to depositing a layer of copper to prevent such diffusion.

A number of processes for applying copper metallization to semiconductor workpieces have been developed in recent years. One such process is chemical vapor deposition (CVD), in which a thin copper film is formed on the surface of the barrier layer by thermal decomposition and/or reaction of gas phase copper compositions. A CVD process can result in conformal copper coverage over a variety of topological profiles, but such processes are expensive when used to implement an entire metallization layer.

Another known technique, physical vapor deposition (PVD), can readily deposit copper on the barrier layer with relatively good adhesion when compared to CVD processes. One disadvantage of PVD processes, however, is that they result in poor (non-conformal) step coverage when used to fill microstructures, such as vias and trenches, disposed in the surface of the semiconductor workpiece. For example, such non-conformal coverage results in less copper deposition at the bottom and especially on the sidewalls of trenches in the semiconductor devices.

Inadequate deposition of a PVD copper layer into a trench to form an interconnect line in the plane of a metallization layer is illustrated in FIG. 1. As illustrated, the upper portion of the trench is effectively "pinched off" before an adequate amount of copper has been deposited within the lower portions of the trench. This result in an open void region that seriously impacts the ability of the metallization line to carry the electrical signals for which it was designed.

Electrochemical deposition of copper has been found to provide the most cost-effective manner in which to deposit a copper metallization layer. In addition to being economically viable, such deposition techniques provide substantially conformal copper films that are mechanically and electrically suitable for interconnect structures. These techniques, however, are generally only suitable for applying copper to an electrically conductive layer. As such, an underlying conductive seed layer is generally applied to the workpiece before it is subject to an electrochemical deposition process. Techniques for electrodeposition of copper on a barrier layer material have not heretofore been commercially viable.

The present inventors have recognized that there exists a need to provide copper metallization processing techniques that 1) provide conformal copper coverage with adequate adhesion to the barrier layer, 2) provide adequate deposition speeds, and 3) are commercially viable. These needs are met by the apparatus and processes of the present invention as described below.

BRIEF SUMMARY OF THE INVENTION

A process for applying a metallization interconnect structure to a semiconductor workpiece having a barrier layer deposited on a surface thereof is set forth. The process includes the forming of an ultra-thin metal seed layer on the barrier layer. The ultra-thin seed layer has a thickness of less than or equal to about 500 Angstroms. The ultra-thin seed layer is then enhanced by depositing additional metal thereon to provide an enhanced seed layer. The enhanced seed layer has a thickness at all points on sidewalls of substantially all recessed features distributed within the workpiece that is equal to or greater than about 10% of the nominal seed layer thickness over an exteriorly disposed surface of the workpiece.

In accordance with a specific embodiment of the process, a copper metallization interconnects structure is formed. To this end, the ultra-thin seed layer is enhanced by subjecting the semiconductor workpiece to an electrochemical copper deposition process in which an alkaline bath having a complexing agent is employed. The copper complexing agent may be at least one complexing agent selected from a group consisting of EDTA, ED, and a polycarboxylic acid such as citric acid or salts thereof.

BRIEF DESCRIPTION OF THE SEVERAL VIEWS OF THE DRAWINGS

FIG. 1 is a cross-sectional view illustrating an interconnect line formed completely by PVD copper.

FIGS. 2A–2F are cross-sectional views through a semiconductor workpiece illustrating the various layers of material as they are applied in accordance with one embodiment of the present invention.

FIG. 7 is a schematic representation of a section of a semiconductor manufacturing line suitable for implementing the disclosed seed layer enhancement steps.

DETAILED DESCRIPTION OF THE INVENTION

Figure 3:
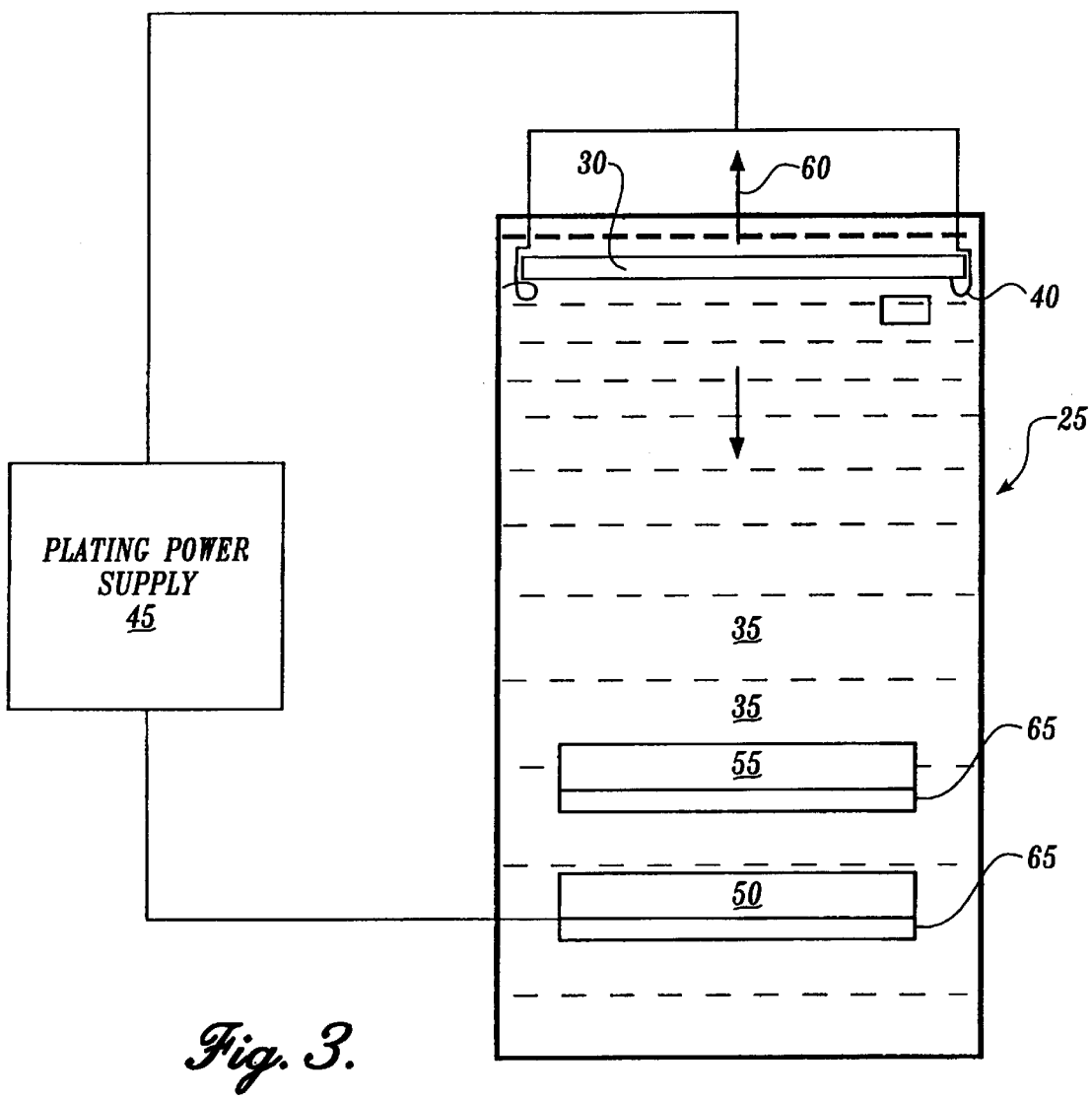
FIG. 3 is a schematic representation of an apparatus suitable for enhancing an ultra-thin seed layer.

This invention employs a novel approach to the copper metallization of a semiconductor article resulting in a copper layer that is uniformly deposited in a conformal coating on the barrier layer with good adhesion to the barrier layer. In accordance with the invention, an alkaline electrolytic copper bath is used to enhance an ultra-thin copper seed layer which has been deposited on the barrier layer using a deposition process such as PVD. The enhanced copper seed layer provides an excellent conformal copper coating that allows trenches and vias to be subsequently filled with a copper layer having good uniformity using electrochemical deposition techniques.

A cross-sectional view of a micro-structure, such as trench 5, that is to be filled with copper metallization is illustrated in FIG. 2A. As shown, a thin barrier layer 10 of, for example, titanium nitride or tantalum nitride is deposited over the surface of a semiconductor device or, as illustrated in FIG. 2A, over a layer of a dielectric 8, such as silicon dioxide. The barrier layer 10 acts to prevent the migration of copper to any semiconductor device formed in the substrate. Any of the various known techniques, such as CVD or PVD, can be used to deposit the barrier layer depending on the particular barrier material being used. Preferably, the thickness for the barrier layer is approximately 100 to 300 Angstroms.

After the deposition of the barrier layer, an ultra-thin copper seed layer 15 is deposited on the barrier layer 10. The resulting structure is illustrated in FIG. 2B. Preferably, the copper seed layer 15 is formed using a vapor deposition technique, such as CVD or PVD. In order to have adequate adhesion and copper coverage, a relatively thick (1000 Angstroms) copper seed layer is usually required. Such a thick seed layer leads to problems with close-off of small geometry trenches, however, when a PVD deposition process is employed for applying the seed layer.

Contrary to traditional thoughts regarding seed layer application, the copper seed layer 15 of the illustrated embodiment is ultra-thin, having a thickness of about 50 to about 500 Angstroms, preferably about 100 to about 250 Angstroms, and most preferably about 200 Angstroms. The ultra-thin copper seed layer can be deposited using a CVD or a PVD process, or a combination of both. PVD is the preferred application process, however, because it can readily deposit copper on the barrier layer 10 with relatively good adhesion. By depositing an ultra-thin seed layer of copper, rather than the relatively thick seed layer used in the prior art, pinching off of the trenches can be avoided.

The use of an ultra-thin seed layer 15 generally introduces its own set of problems. One of the most significant of these problems is the fact that such ultra-thin layers do not generally coat the barrier layer 10 in a uniform manner. Rather, voids or non-continuous seed layer regions on the sidewalls, such as at 20, are often present in an ultra-thin seed layer 15 thereby resulting in the inability to properly apply a subsequent electrochemically deposited copper layer in the regions 20. Further, ultra-thin seed layers tend to include spikes, such as at 21, that impact the uniformity of the subsequent electrolytically deposited metal layer. Such spikes 21 result in high potential regions at which the copper deposits at a higher rate than at other, more level regions. As such, the seed layer 15 is not fully suitable for the traditional electroplating techniques typically used after application of a seed layer.

The present inventors have found that an ultra-thin seed layer can be employed if it is combined with a subsequent electrochemical seed layer enhancement technique. To this end, the semiconductor workpiece is subject to a subsequent process step in which a further amount of copper 18 is applied to the ultra-thin seed layer to thereby enhance the seed layer. A seed layer enhanced by the additional deposition of copper is illustrated in FIG. 2C. As shown in FIG. 2C, the void or non-continuous regions 20 of FIG. 2B have been filled thereby leaving substantially all of the barrier layer 10 covered with copper.

Preferably, the seed layer enhancement process continues until a sidewall step coverage, i.e., the ratio of the seed layer thickness at the bottom sidewall regions 22 to the nominal thickness of the seed layer at the exteriorly disposed side 23 of the workpiece, achieves a value of at least 10%. More preferably, the sidewall step coverage is at least about 20%. Such sidewall step coverage values are present in substantially all of the recessed structures of the semiconductor workpiece. It will be recognized, however, that certain recessed structures distributed within the semiconductor workpiece may not reach these sidewall step coverage values. For example, such structures disposed at the peripheral edges of a semiconductor wafer may not reach these step coverage values. Similarly, defects or contaminants at the situs of certain recessed structures may prevent them from reaching the desired coverage values. The nominal thickness of the enhanced seed layer at the exteriorly disposed side of the workpiece is preferably in the range of 500 angstroms 1600 angstroms.

Although the embodiment of the process disclosed herein is described in connection with copper metallization, it is understood that the basic principle of the enhancement of an ultra-thin seed layer prior to the bulk deposition thereof can be applied to other metals or alloys that are capable of being electroplated. Such metals include iron, nickel, cobalt, zinc, copper-zinc, nickel-iron, cobalt-iron, etc.

A schematic representation of an apparatus 25 suitable for enhancing the ultra-thin copper seed layer is illustrated in FIG. 3. As shown, a semiconductor workpiece, such as a semiconductor wafer 30, is positioned face down in a bath 35 of electroplating solution. One or more contacts 40 are provided to collect the wafer 30 to a plating power supply 45 as a cathode of an electroplating cell. An anode 50 is disposed in the bath 35 and is connected to the plating power supply 45. Preferably, a diffuser 55 is disposed between the anode 50 and the wafer/cathode 30. The wafer 30 may be rotated about axis 60 during the enhancement process. Anode 50 may be provided with a dielectric shield 65 at a backside thereof which faces an incoming stream of plating bath fluid.

The electrolytic bath solution for enhancing the seed layer is an alkaline copper bath in which copper ions are complexed with a complexing agent. A preferred source of copper ions is copper sulfate ($CuSO_4$). The concentration of copper sulfate in the bath is preferably within the range of 0.03 to 0.25 M, and is more preferably about 0.1 M.

Complexing agents that are suitable for use in the present invention form a stable complex with copper ions and prevent the precipitation of copper hydroxide. Ethylene diamine tetracetic acid (EDTA), ethylene diamine (ED), citric acid, and their salts have been found to be particularly suitable copper complexing agents. The molar ratio of complexing agent to copper sulfate in the bath is preferably within the range of 1 to 4, and is preferably about 2. Such complexing agents can be used alone, in combination with one another, or in combination with one or more further complexing agents.

The electrolytic bath is preferably maintained at a pH of at least 9.0. Potassium hydroxide, ammonium hydroxide, or sodium hydroxide is utilized to adjust and maintain the pH at the desired level of 9.0 or above. A preferred pH for a citric acid or ED bath is about 9.5, while a preferred pH for an EDTA bath is about 12.5.

Additional components can be added to the alkaline copper bath. For example, boric acid ($H_3BO_3$) aids in maintaining the pH at 9.5 when citric acid or ED is used as the complexing agent, and provides brighter copper deposits when added to an electrolytic bath containing EDTA as the complexing agent. If boric acid is added, its concentration in the bath is preferably within the range of 0.01 to 0.5 M.

In general, the temperature of the bath can be within the range of 20 to 35° C., with 25° C. being a preferred temperature. The current density for electrolytically depositing copper to enhance the copper seed layer can be 1 to 5 milliamps/cm , while a plating time of about 1 to about 5 minutes is sufficient to enhance the copper seed layer. The plating waveform may be, for example, a forward periodic pulse having a period of 2 msec at a 50% duty cycle.

An amine free acid complexing agent, for example, a polycarboxylic acid, such as citric acid, and salts thereof, is preferable to the use of EDTA or ED. EDTA and ED include amine groups. These amine groups often remain on the surface of the semiconductor workpiece after rinsing and drying of the wafer. Subsequent processes, particularly such processes as photolithographic processes, may be corrupted by the reactions resulting from the presence of these amine groups. The amine groups may, for example, interfere with the chemical reactions associated with the exposing and/or curing of photoresist materials. As such, amine free complexing agents are particularly suitable in processes in which a photolithographic process follows an electrodeposition process.

Figure 4A:
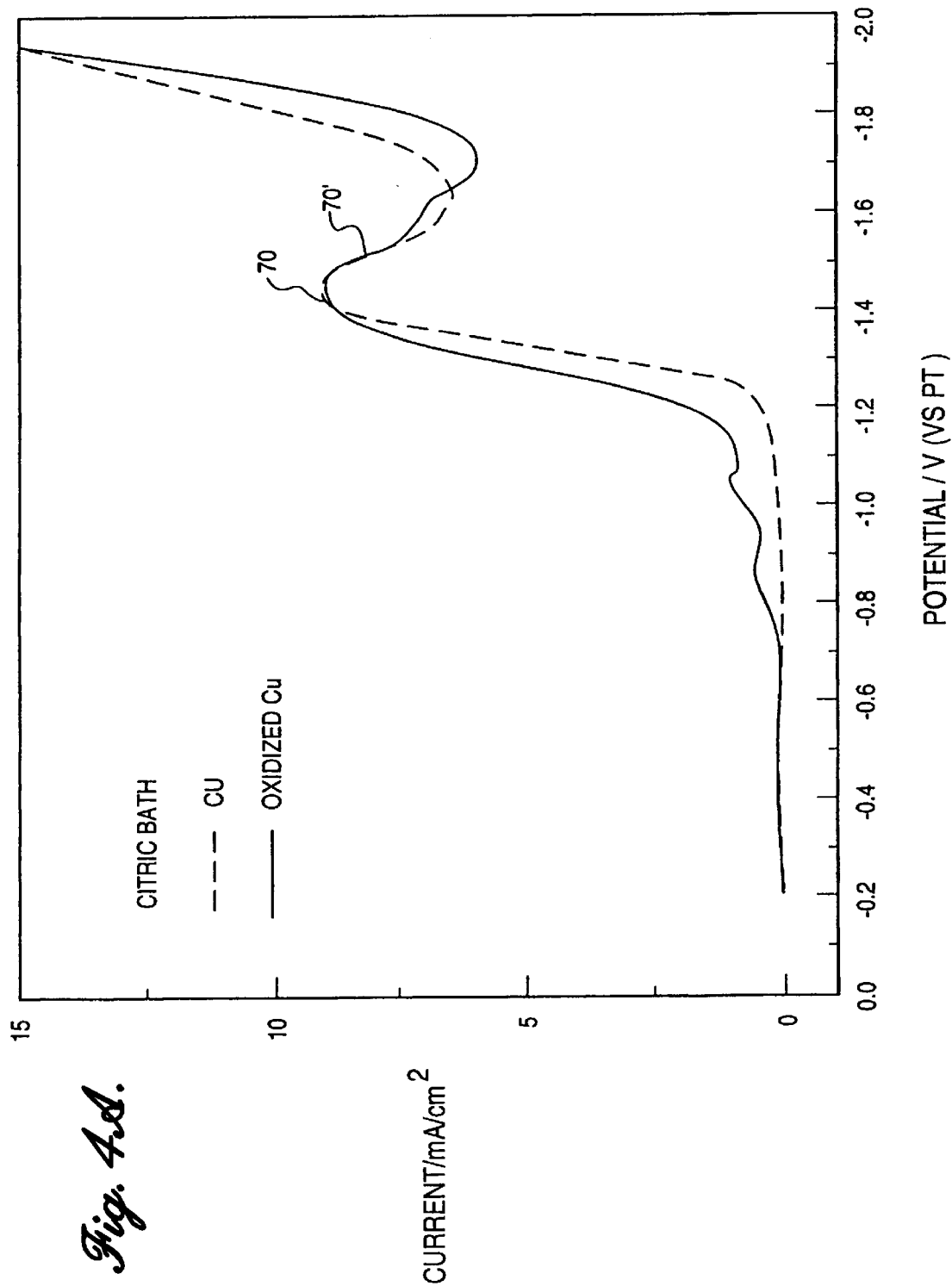
FIG. 4A is a graph illustrating the current-potential curves of a plating solution using a polycarboxylic acid, such as citric acid, as a complexing agent.
Figure 4B:
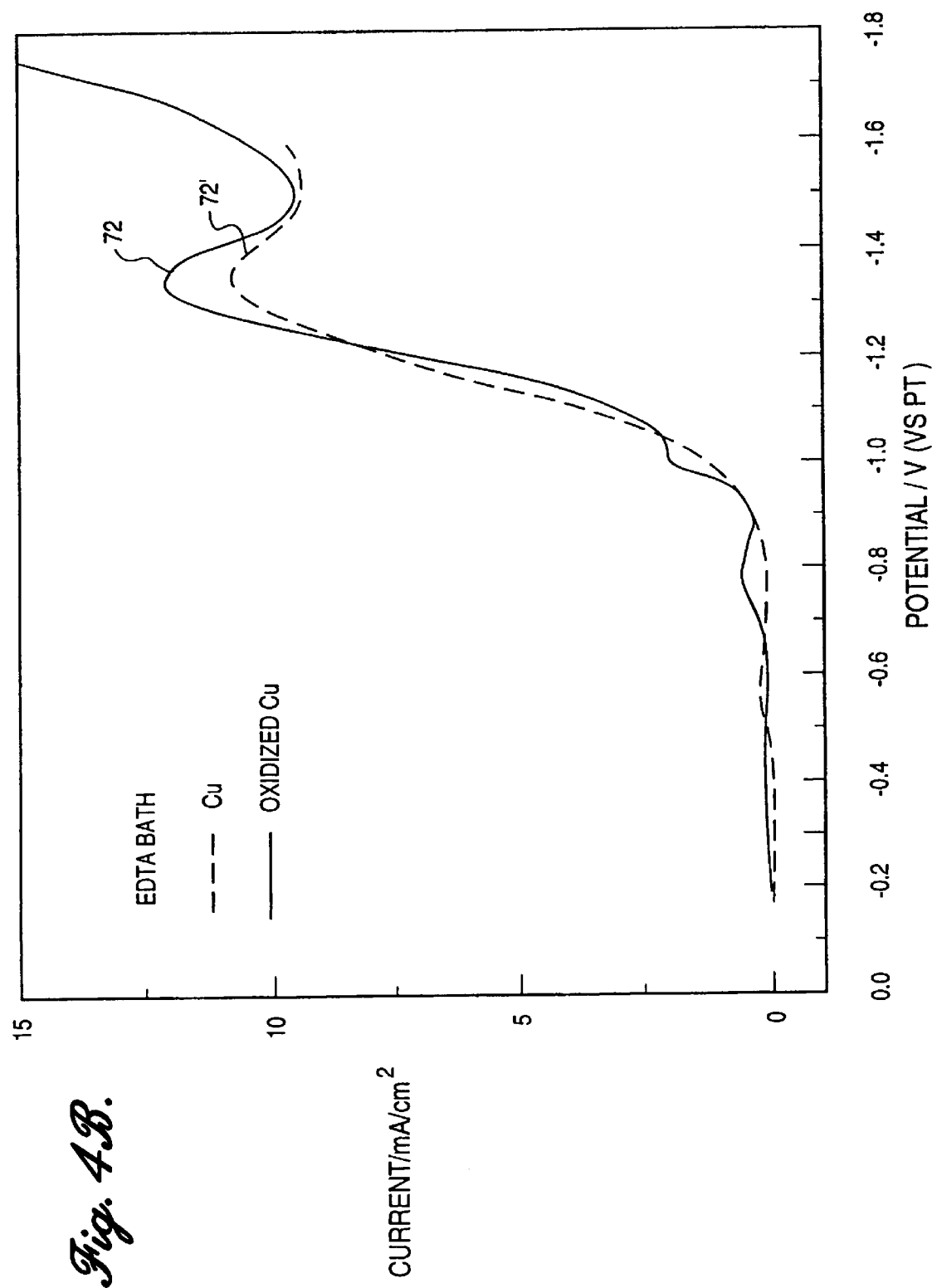
FIG. 4B a graph illustrating the current-potential curves of a plating solution using EDTA, an amine-containing plating solution, as the complexing agent.

A further advantage of using a polycarboxylic acid, such as citric acid, stems from the fact that the magnitude of the voltage potential at which the copper is plated is greater than the magnitude of the voltage potential at which the copper is plated in a bath containing EDTA. This is illustrated in FIGS. 4A and 4B where FIG. 4A is a current-potential graph for a citric acid bath, and FIG. 4B is a current-potential graph for an EDTA bath. Electroplating takes place at the voltage where the corresponding current increases abruptly. This plating voltage is referred to as the deposition potential, which is approximately −1.25 volts as shown in FIG. 4A for a bath employing citric acid as the complexing agent, and is approximately −1.0 volts as shown in FIG. 4B for a bath employing EDTA as the complexing agent. The current peaks (70*a*, 70'0 for the a bath containing a citric acid, and 72, 72' for the bath containing the EDTA) are the limiting currents which are mainly determined by mass transfer and the concentration of copper ions in the plating solutions. As illustrated, the magnitude of the current and the particular plating potential is slightly dependent on the substrate material. The different substrate results are illustrated in FIGS. 4A and 4B, where 70 and 72 are the curves for a copper substrate material, and 70' and 72' are curves for a copper substrate material comprised of copper with a copper oxide coating. It is noted that additional peaks occur on oxidized copper in the same electrolytes. These peaks are related to the electrochemical reduction of copper oxide to metallic copper before the alkaline electrochemical copper deposition.

It is believed that a copper layer plated at a higher plating potential in an alkaline bath provides greater adhesion to the underlying barrier layer than a copper layer plated at a lower plating potential in an acid bath. For copper to adhere to the barrier material, it is thought that copper ions must impinge on the barrier surface with sufficient energy to penetrate a thin oxidized or contaminated layer at the barrier surface. It is therefore believed that a copper layer deposited at a higher magnitude plating potential adheres is better to the exposed barrier layer during the plating process when compared to a layer plated using a smaller magnitude plating potential. This factor, combined with the inter-copper chemical between the PVD copper and the electrochemically deposited copper provides for an enhanced seed layer having excellent electrical as well as barrier adhesion properties.

With the seed layer enhanced in the foregoing manner, it is suitable for subsequent electrochemical copper deposition. This subsequent copper deposition may take place in an alkaline bath within the apparatus employed to enhance the seed layer. Preferably, however, subsequent copper deposition takes place in an acid environment where plating rates are substantially higher than corresponding rates associated with alkaline plating baths. To this end, the semiconductor workpiece is preferably transferred to an apparatus wherein the workpiece is thoroughly rinsed with deionized water and then transferred to an apparatus similar to that of FIG. 3 wherein the plating bath is acidic. For example, one suitable copper bath comprises 170 g/l $H_2SO_4$, 17 g/l copper and 70 ppm Chloride ions with organic additives. The organic additives are not absolutely necessary to the plating reaction. Rather, the organic additives may be used to produce desired film characteristics and provide better filling of the recessed structures on the wafer surface. The organic additives may include levelers, brighteners, wetting agents and ductility enhancers. It is during this deposition process that the trench 5 is substantially filled with a further layer of electrochemically deposited copper 22. The resulting filled cross-section is illustrated in FIG. 2D. After being filled in this manner, the barrier layer and the copper layers disposed above the trench are removed using any suitable process thereby leaving only the trench 5 with the copper metallization and associated barrier material as shown in FIG. 2E.

Use of an alkaline electrolytic bath to enhance the copper seed layer has particular advantages over utilizing acid copper baths without seed layer enhancement. After deposition of the PVD copper seed layer, the copper seed layer is typically exposed to an oxygen-containing environment. Oxygen readily converts metallic copper to copper oxide. If an acid copper bath is used to plate copper onto the seed layer after exposure of the seed layer to an oxygen containing environment, the acid copper bath would dissolve copper oxide that had formed, resulting in voids in the seed layer and poor uniformity of the copper layer deposited on the seed layer. Use of an alkaline copper bath in accordance with the disclosed embodiment avoids the problem by advantageously reducing any copper oxide at the surface of the seed layer to metallic copper. Another advantage of the alkaline copper bath is that the plated copper has much better adhesion to the barrier layer than that plated from an acid copper bath. Additional advantages of the present invention can be seen from the following Example.

EXAMPLE 1

Comparison of Acid Copper Plating With and Without Seed Layer Enhancement

Semiconductor wafers 1, 2 and 3 were each coated with a 200 Angstrom PVD copper seed layer. In accordance with the present invention, wafers 1 and 2 had seed layer enhancement from citric acid and EDTA baths, respectively, the compositions of which are set forth below:

Bath for Wafer 1: 0.1 M Cu $SO_4$+0.2 M Citric acid+0.05 M $H_3BO_3$ in D.I. water at pH 9.5, temperature 25° C.
Bath for Wafer 2: 0.1 M Cu $SO_4$+0.2 M EDTA acid+0.05 M $H_3BO_3$ in D.I. water at pH 12.5, temperature 25° C.
Wafer 3 did not have any seed layer enhancement.

The three wafers were then plated with a 1.5 micron copper layer from an acid copper bath under identical conditions. The following Table compares the uniformities, as deduced from sheet resistance measurements, of the three wafers after the deposition of a copper layer having a nominal thickness of 1.5 microns.

TABLE 1

| Wafer | Enhancement Bath | Current Density | Non-uniformity Standard deviation (%, 1σ) |
|---|---|---|---|
| 1 | Citrate | 3 min. at 2 mA/cm² | 7.321 |
| 2 | EDTA | 3 min. at 2 mA/cm² | 6.233 |
| 3 | None | 0 | 46.10 |

As can be seen from the results in Table 1 above, seed layer enhancement in accordance with the disclosed process provides excellent uniformity (6 to 7%) compared to that without seed layer enhancement (46%). This is consistent with observations during visual examination of the wafer after 1.5 micron electroplated copper had been deposited. Such visual examination of the wafer revealed the presence of defects at wafer electrode contact points on the wafer without seed layer enhancement.

Figure 5:
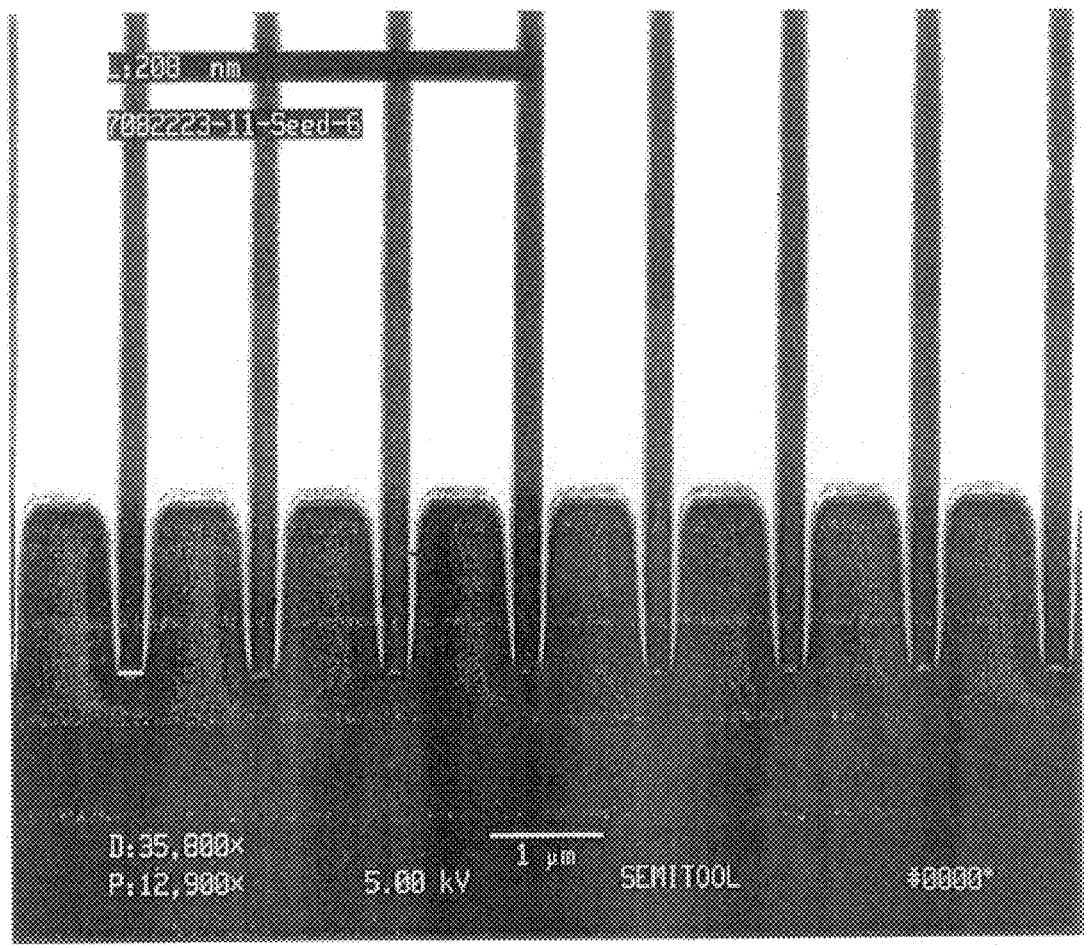
FIG. 5 is a scanning eletromicrograph photograph illustrating an ultra-thin seed layer.
Figure 6A:
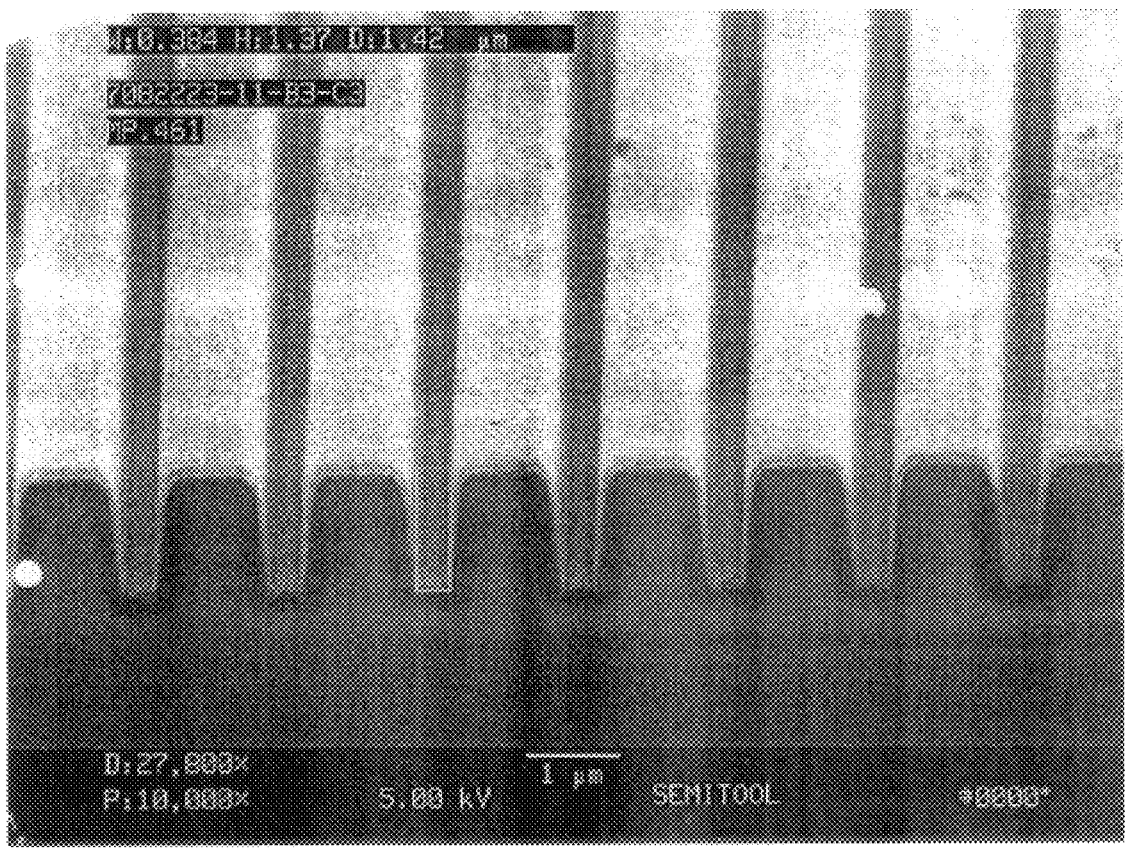
FIG. 6A is a scanning eletromicrograph photograph illustrating an ultra-thin seed layer that has been enhanced in a citric acid bath.
Figure 6B:
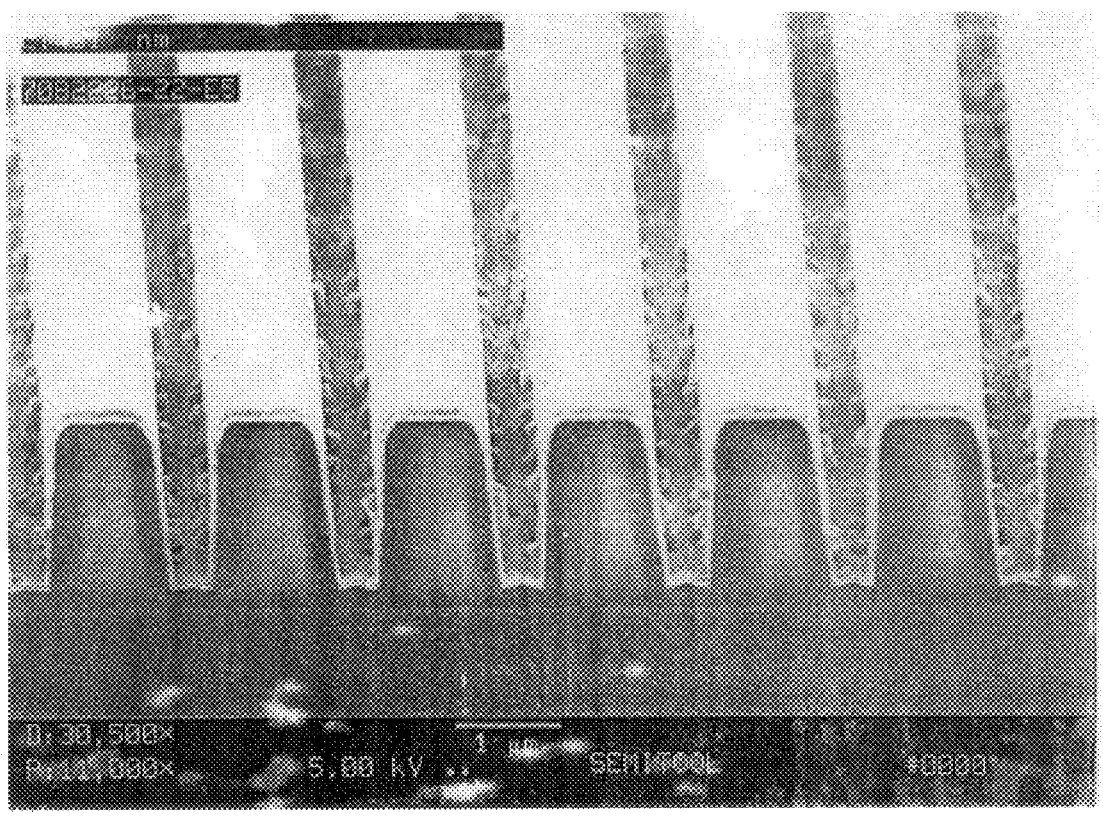
FIG. 6B is a scanning eletromicrograph photograph illustrating an ultra-thin seed layer that has been enhanced in an EDTA bath.

FIGS. 5, 6A and 6B are photographs taken using a SEM. In FIG. 5, an ultra-thin seed layer has been deposited on the surface of a semiconductor wafer, including microstructures, such as trenches 85. As shown, void regions are present at the lower corners of the trenches. In FIG. 6A, the seed layer has been enhanced in the manner described above in a bath containing citric acid as the complexing agent. This enhancement resulted in a conformal copper seed layer that is very suited for subsequent electrochemical deposition of copper metallization.

FIG. 6B illustrates a seed layer that has been enhanced in a bath containing EDTA as the complexing agent. The resulting seed layer includes larger grain sizes that project as spikes from the sidewalls of the trenches. These sidewall grain projections make subsequent electrochemical deposition filling of the trenches more difficult since they localize a higher plating rate resulting in non-uniformity of the subsequent electrochemical deposition. This effect is particularly noticeable in recessed micro-structures having small dimensions. As such, a complexing agent such as citric acid is more preferable when filling small micro-structures. Results comparable for copper baths containing citric acid have also been achieved using ED as the complexing agent.

FIG. 7 is a schematic representation of a section of a semiconductor manufacturing line 90 suitable for implementing the foregoing processes. The line 90 includes a vapor deposition tool or tool set 95 and an electrochemical copper deposition tool or tool set 100. Transfer of wafers between the tools/tool sets 95 and 100 may be implemented manually or through an automated transfer mechanism 105. Preferably, automated transfer mechanism 105 transfers workpieces in a pod or similar environment. Alternatively, the transfer mechanism 105 may transfer wafers individually or in an open carrier through a clean atmosphere joining the tools/tool sets.

In operation, vapor deposition tool/tool set 95 is utilized to apply an ultra-thin copper seed layer over at least portions of semiconductor workpieces that are processed on line 90. Preferably, this is done using a PVD application process. Workpieces with the ultra-thin seed layer are then transferred to tool/tool set 100, either individually or in batches, where they are subject to electrochemical seed layer enhancement at, for example, processing station 110. Processing station 110 may be constructed in the manner set forth in FIG. 3. After enhancement is completed, the workpieces are subject to a full electrochemical deposition process in which copper metallization is applied to the workpiece to a desired interconnect metallization thickness. This latter process may take place at station 110, but preferably occurs at further processing station 115 which deposits the copper metallization in the presence of an acidic plating bath. Before transfer to station 115, the workpiece is preferably rinsed in DI water at station 112. Transfer of the wafers between stations 110, 112, and 115 may be automated by a wafer conveying system 120. The electrochemical deposition tool set 100 may be implemented using, for example, an LT-210™ model or an Equinox™ model plating tool available from Semitool, Inc., of Kalispell, Mont.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A process for applying a metal to a microelectronic workpiece, the microelectronic workpiece including an exteriorly disposed surface having a plurality of micro-recessed structures that are defined by sidewalls, the microelectronic workpiece further including a barrier layer deposited on at least a portion of the exteriorly disposed surface of the microelectronic workpiece and on at least substantial portions of the walls of the plurality of micro-recessed structures, the process comprising the steps of:
    (a) forming an ultra-thin metal seed layer exterior to the barrier layer using a first deposition process, the seed layer having a thickness of less than or equal to about 500 Angstroms;
    (b) repairing the ultra-thin seed layer by depositing an additional metal using a second deposition process that is different from the first deposition process to provide a repaired seed layer that is suitable for subsequent electroplating, the repaired seed layer having a thickness at all points on sidewalls of substantially all micro-recessed structures distributed within the workpiece that is equal to or greater than about 10% of the nominal thickness of the enhanced seed layer over the exteriorly disposed surface of the workpiece;
    (c) electroplating a metal onto the repaired seed layer using a third deposition process using processing parameters that are different from processing parameters used in the second deposition process.

2. The process of claim 1 wherein the additional metal is copper.

3. The process of claim 1 wherein the ultra-thin seed layer is enhanced by a process comprising an electrochemical deposition step.

4. The process of claim 3 wherein the electrochemical deposition step occurs in an alkaline bath.

5. The process of claim 4 wherein the alkaline bath comprises metal ions and an agent effective in complexing the metal ions.

6. The process of claim 5 wherein the complexing agent is comprised of one or more complexing agents selected from EDTA, ED, and polycarboxylic acid.

7. The process of claim 5 wherein the complexing agent is comprised of EDTA and the EDTA in the bath has a concentration within the range of 0.03 to 1.0 M.

8. The process of claim 6 wherein the complexing agent is comprised of ED and wherein the ED in the electrolytic bath has a concentration within the range of 0.03 to 1.0 M.

9. The process of claim 6 wherein the complexing agent is comprised of citric acid and the citric acid in the bath has a concentration within the range of 0.03 to 1.0 M.

10. The process of claim 7 wherein the complexing agent is comprised of EDTA and the EDTA has a concentration within the range of 0.1 to 0.4 M.

11. The process of claim 4 wherein the third deposition process takes place in an acidic electrolytic solution to the metal to at least a thickness needed to substantially fill the micro-recessed structures.

12. The process of claim 11 and further comprising the step of subjecting the microelectronic workpiece to a rinsing process after electrochemical deposition in the alkaline bath and prior to the further electrochemical deposition process in an acidic electrolytic solution.

13. The process of claim 1 wherein the ultra-thin metal seed layer formed in step (a) is formed by physical vapor deposition.

14. The process of claim 1 wherein the ultra-thin metal seed layer formed in step (a) has a thickness of about 50 to about 500 Angstroms.

15. The process of claim 14 wherein the ultra-thin metal layer formed in step (a) has a thickness of about 100 to about 250 Angstroms.

16. In a manufacturing line including a plurality of apparatus for the manufacture of micro-sized metal structures on a microelectronic workpiece, one or more apparatus of the plurality of apparatus being used for applying metal to a surface of the microelectronic workpiece, the one or more apparatus comprising:
    means for applying a conductive ultra-thin seed layer to a surface of the microelectronic workpiece using a first deposition process, the ultra-thin seed layer having a thickness of less than 500 Angstroms;
    means for electrochemically repairing the conductive ultra-thin seed layer using a second deposition process that differs from the first deposition process to thereby provide repaired seed layer that is suitable for subsequent electroplating;
    means for electroplating a metal onto the repaired seed layer to a predetermined thickness representing a bulk portion of the micro-sized metal structure.

17. One or more apparatus as claimed in claim 16 wherein the means for applying is further defined by means for applying a conductive ultra-thin copper seed layer to a barrier layer surface of the microelectronic workpiece.

18. One or more apparatus as claimed in claim 17 wherein the means for electrochemically enhancing the conductive ultra-thin seed layer is further defined by means for electrochemically enhancing the conductive ultra-thin seed layer by electrochemically depositing copper using an alkaline copper bath having a complexing agent.

19. One or more apparatus as claimed in claim 18 wherein the electrochemical enhancement of the ultra-thin seed layer takes place at a plating voltage having a magnitude that is at least about or greater than 1.1 volts.

20. One or more apparatus as claimed in claim 18, wherein the alkaline bath has a pH> or equal to about 9.0.

21. One or more apparatus as claimed in claim 18 wherein the complexing agent is comprised of EDTA.

22. One or more apparatus as claimed in claim 18 wherein the complexing agent is comprised of ED.

23. One or more apparatus as claimed in claim 18 wherein the complexing agent is a comprised of a carboxylic acid or salt thereof.

24. One or more apparatus as claimed in claim 23 wherein the complexing agent is citric acid or salt thereof.

25. One or more apparatus as claimed in claim 18 wherein said means for electroplating comprises means for electroplating copper over the repaired seed layer by using an acidic copper bath.

26. One or more apparatus as claimed in claim 25 wherein the electrochemical enhancement of the ultra-thin seed layer takes place at a plating voltage having a magnitude that is greater than the magnitude of the plating voltage in the acidic copper bath.

27. One or more apparatus as claimed in claim 26 and further comprising means for rinsing the microelectronic workpiece prior to its introduction to the means for electrochemically adding a further layer of copper.

28. One or more apparatus as claimed in claim 16 wherein the means for applying is further defined by means for applying a conductive ultra-thin copper seed layer to a barrier layer surface of the microelectronic workpiece using a PVD process.

29. One or more apparatus as claimed in claim 16 wherein the means for applying is further defined by means for applying a conductive ultra-thin copper seed layer to a barrier layer surface of the microelectronic workpiece using a CVD process.

30. A process for applying a metal to a surface of a microelectronic workpiece pursuant to forming one or more micro-sized metal structures thereon, the microelectronic workpiece including a barrier layer deposited on at least a portion of the surface of the microelectronic workpiece, the process comprising the steps of:
 (a) forming an ultra-thin metal seed layer on the barrier layer, the ultra-thin metal seed layer having a thickness of less than 500 Angstroms;
 (b) subjecting the microelectronic workpiece to a first electrochemical copper deposition process in an alkaline electrolytic bath having copper ions complexed with a complexing agent such that additional copper is deposited on the ultra-thin metal seed layer to repair the seed layer so that is suitable for subsequent electrochemical deposition;
 (c) subjecting the microelectronic workpiece to a second electrochemical copper deposition process using processing parameters that differ from processing parameters used in the first electrochemical copper deposition process.

31. The process of claim 30 wherein the ultra-thin metal seed layer formed in step (a) is formed by physical vapor deposition.

32. The process of claim 30 wherein the ultra-thin seed layer formed in step (a) has a thickness of about 50 to about 500 Angstroms.

33. The process of claim 32 wherein the ultra-thin seed layer formed in step (a) has a thickness of about 100 to about 250 Angstroms.

34. The process of claim 33 wherein the ultra-thin seed layer formed in step (a) has a thickness of about 200 Angstroms.

35. The process of claim 30 wherein the alkaline electrolytic bath has a pH of at least 9.0.

36. The process of claim 30 wherein the copper ions in the electrolytic bath are provided by copper sulfate.

37. The process of claim 36 wherein the copper sulfate in the electrolytic bath has a concentration within the range of 0.03 to 0.25 M.

38. The process of claim 36 wherein the concentration of copper sulfate is about 0.1 M.

39. The process of claim 30 wherein the copper complexing agent is comprised of a copper complexing agent selected from EDTA, ED, and citric acid.

40. The process of claim 39 wherein the complexing agent is comprised of EDTA and the EDTA in the electrolytic bath has a concentration within the range of 0.03 to 1.0 M.

41. The process of claim 39 wherein the complexing agent is comprised of ED and the ED in the electrolytic bath has a concentration within the range of 0.03 to 1.0 M.

42. The process of claim 39 wherein the complexing agent is comprised of EDTA and the EDTA has a concentration within the range of 0.1 to 0.4 M.

43. The process of claim 30 wherein the complexing agent is comprised of citric acid.

44. The process of claim 43 wherein the citric acid has a concentration within the range of 0.1 to 0.4 M.

45. The process of claim 30 wherein the second electrochemical copper deposition process takes place in an acidic electrolytic solution to complete deposition of the copper to a thickness needed for the formation of the micro-sized metal structure.

46. The process of claim 45 and further comprising the step of subjecting the microelectronic workpiece to a rinsing process after step (b) and prior to the second electrochemical copper deposition process in the acidic electrolytic solution.

47. A process for applying a metal to a microelectronic workpiece pursuant to forming a micro-sized metal structure on a surface of the microelectronic workpiece, the process comprising:
 (a) forming a metal seed layer on a surface of the workpiece using a first deposition process, the metal seed layer being generally unsuitable for bulk deposition of a metal that is to be used to form the micro-sized metal structure;
 (b) repairing the seed layer by depositing additional metal on the seed layer using a second deposition process that differs from the first deposition process to thereby provide a repaired seed layer that is suitable for subsequent bulk deposition of a metal that is to be used to form the micro-sized metal structure;
 (c) subjecting the microelectronic workpiece to a third deposition process using processing parameters that differ from processing parameters used in the second deposition process to deposit a bulk amount of the metal that is used to form the micro-sized metal structure.

48. The process of claim 47 wherein the metal layer formed in step (a) has a thickness of about 100 to about 250 Angstroms.

49. The process of claim 48 wherein the metal seed layer of step (a) is formed in a physical vapor deposition process.

50. The process of claim 48 wherein the metal seed layer of step (a) is formed in a chemical vapor deposition process.

51. The process of claim 48 wherein the seed layer is enhanced in step (b) by electrochemically depositing the additional metal.

52. The process of claim 51 wherein the microelectronic workpiece comprises a barrier layer on which the seed layer is formed and wherein the additional metal is electrolytically deposited using an alkaline electrolytic plating solution that includes a complexing agent.

53. The process of claim 52 wherein the deposition of step (c) takes place in an acidic electrolytic plating solution.

54. The process of claim 53 and further comprising the step of rinsing the microelectronic workpiece after electrolytically repairing the seed layer in the alkaline electrolytic plating solution and prior to subjecting the microelectronic workpiece to the acidic electrolytic plating solution.

55. The process of claim 47 wherein the metal seed layer of step (a) is formed in a physical vapor deposition process.

56. The process of claim 47 wherein the metal seed layer of step (a) is formed in a chemical vapor deposition process.

57. The process of claim 56 wherein the microelectronic workpiece comprises a barrier layer on which the seed layer is formed and wherein the additional metal layer is electrolytically deposited using an alkaline electrolytic plating solution that includes a complexing agent.

58. The process of claim 47 wherein the seed layer is enhanced in step (b) by electrochemically depositing the additional metal layer.

59. The process of claim 58 wherein the third deposition process of step (c) comprises the step of electrolytically depositing the bulk amount of the metal on the surface of the repaired seed layer in an acidic electrolytic plating solution.

60. The process of claim 59 and further comprising the step of rinsing the microelectronic workpiece after electrolytically repairing the seed layer in the alkaline electrolytic plating solution and prior to subjecting the microelectronic workpiece to the acidic electrolytic plating solution.

61. In a manufacturing line including a plurality of apparatus for the manufacture of microelectronic circuits or components, one or more apparatus of the plurality of apparatus being used for applying interconnect metallization in a damascene process to a surface of a microelectronic workpiece used to form the microelectronic circuits or components, the one or more apparatus comprising:

means for applying a metal seed layer to a surface of the microelectronic workpiece using a physical vapor deposition process, the metal seed layer being generally unsuitable for bulk electrochemical deposition of the interconnect metallization;

means for electrochemically repairing the metal seed layer to render it suitable for subsequent electrochemical application of a metal to a predetermined thickness representing a bulk portion of the interconnect metallization.

62. A process for applying a metal to a microelectronic workpiece, the process comprising the steps of:

(a) forming a metal seed layer using a first deposition process, the first deposition process physically anchoring the metal seed layer to an underlying layer, the metal seed layer having physical characteristics that render it generally unsuitable for bulk electrolytic deposition of a metal thereon;

(b) repairing the seed layer by electrochemically depositing an additional metal on the seed layer using a second deposition process that is different from the first deposition process to form a repaired seed layer;

(c) electrolytically depositing a metal on the repaired seed layer under conditions in which the deposition rate of the electrolytic deposition process is substantially greater than the deposition rate of the process used to repair the seed layer.

63. A process for filling a micro-recessed structure disposed in a surface of a microelectronic workpiece with a metal, the microelectronic workpiece including a barrier layer deposited on at least a portion of the upper surface thereof and on surfaces of the plurality of micro-recessed structures, the process comprising the steps of:

(a) forming a metal seed layer on the barrier layer using a physical vapor deposition process, the metal seed layer having physical characteristics that render it generally unsuitable for bulk, electrolytic deposition of a metal thereon;

(b) repairing the seed layer by electrolytically depositing additional metal on the ultra-thin metal seed layer using an alkaline electroplating solution to thereby form a repaired seed layer;

(c) substantially filling the micro-recessed structures with a metal in an electrolytic deposition process using an acidic electroplating solution.

64. A process for applying a metal to a microelectronic workpiece, the microelectronic workpiece including a surface in which are disposed a plurality of micro-recessed structures, the process comprising the steps of:

(a) forming an ultra-thin metal seed layer on the surface of the microelectronic workpiece, including the walls of the plurality of micro-recessed structures, the ultra-thin metal seed layer being formed using a first deposition process;

(b) enhancing the ultra-thin seed layer by depositing an additional metal using a second deposition process that is different from the first deposition process to provide an enhanced seed layer, the additional metal being formed from a metal comprising the same metal used to form the ultra-thin seed layer; and (c) electroplating a metal onto the enhanced seed layer so as to fill the micro-recessed structures.

* * * * *

UNITED STATES PATENT AND TRADEMARK OFFICE
CERTIFICATE OF CORRECTION

PATENT NO. : 6,197,181 B1
DATED : March 6, 2001
INVENTOR(S) : L. Chen

It is certified that error appears in the above-identified patent and that said Letters Patent is hereby corrected as shown below:

Column 10,
Lines 5-6 (Claim 11, lines 2-3), "to the metal to" should read -- to deposit the metal to --

Column 12,
Line 9, (Claim 44, line 2), "of0.1" should read -- of 0.1 --

Signed and Sealed this

Thirteenth Day of November, 2001

Attest:

NICHOLAS P. GODICI
Attesting Officer    Acting Director of the United States Patent and Trademark Office

UNITED STATES PATENT AND TRADEMARK OFFICE
CERTIFICATE OF CORRECTION

Figure 4C:
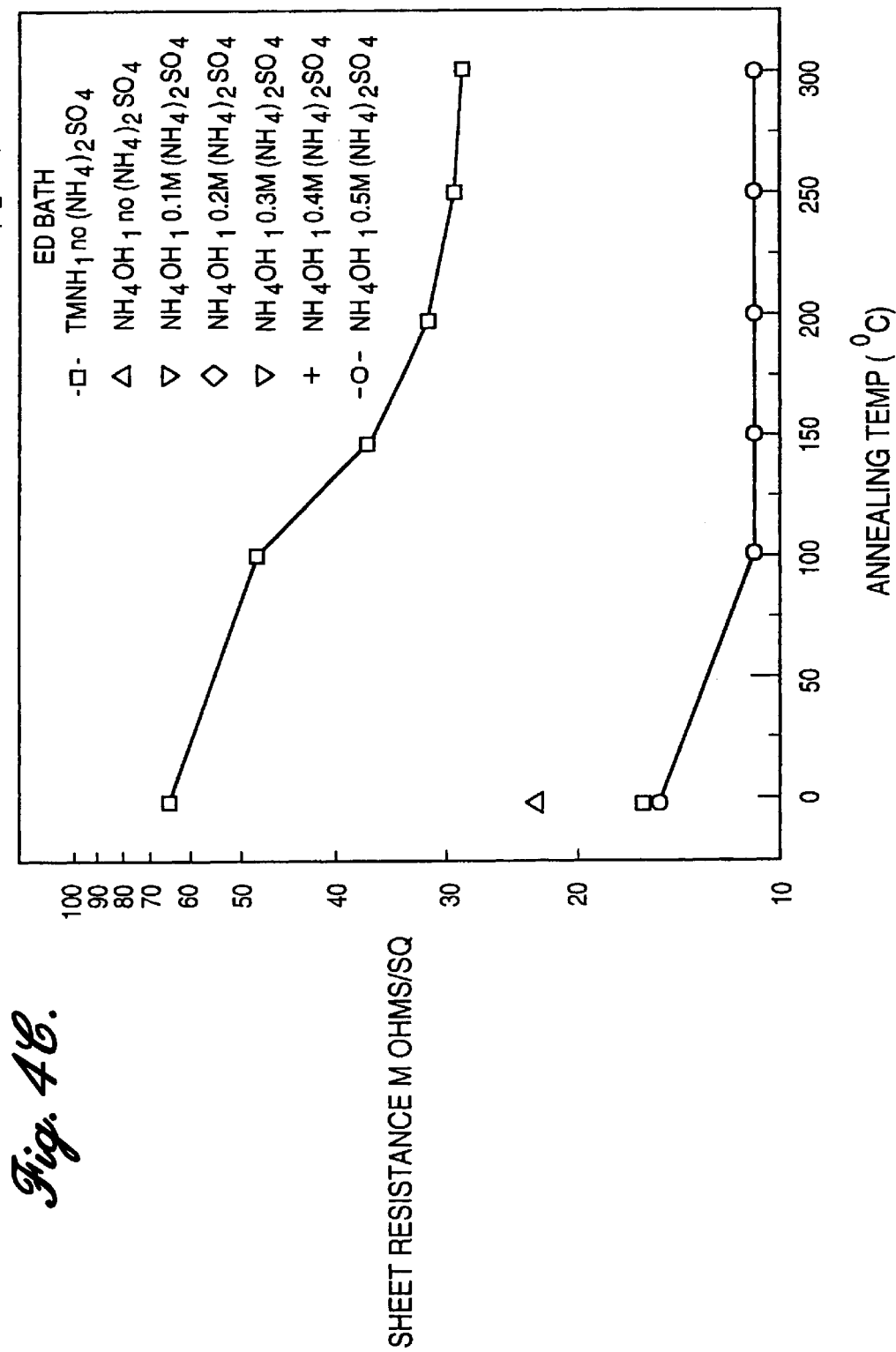
Figure 4D:
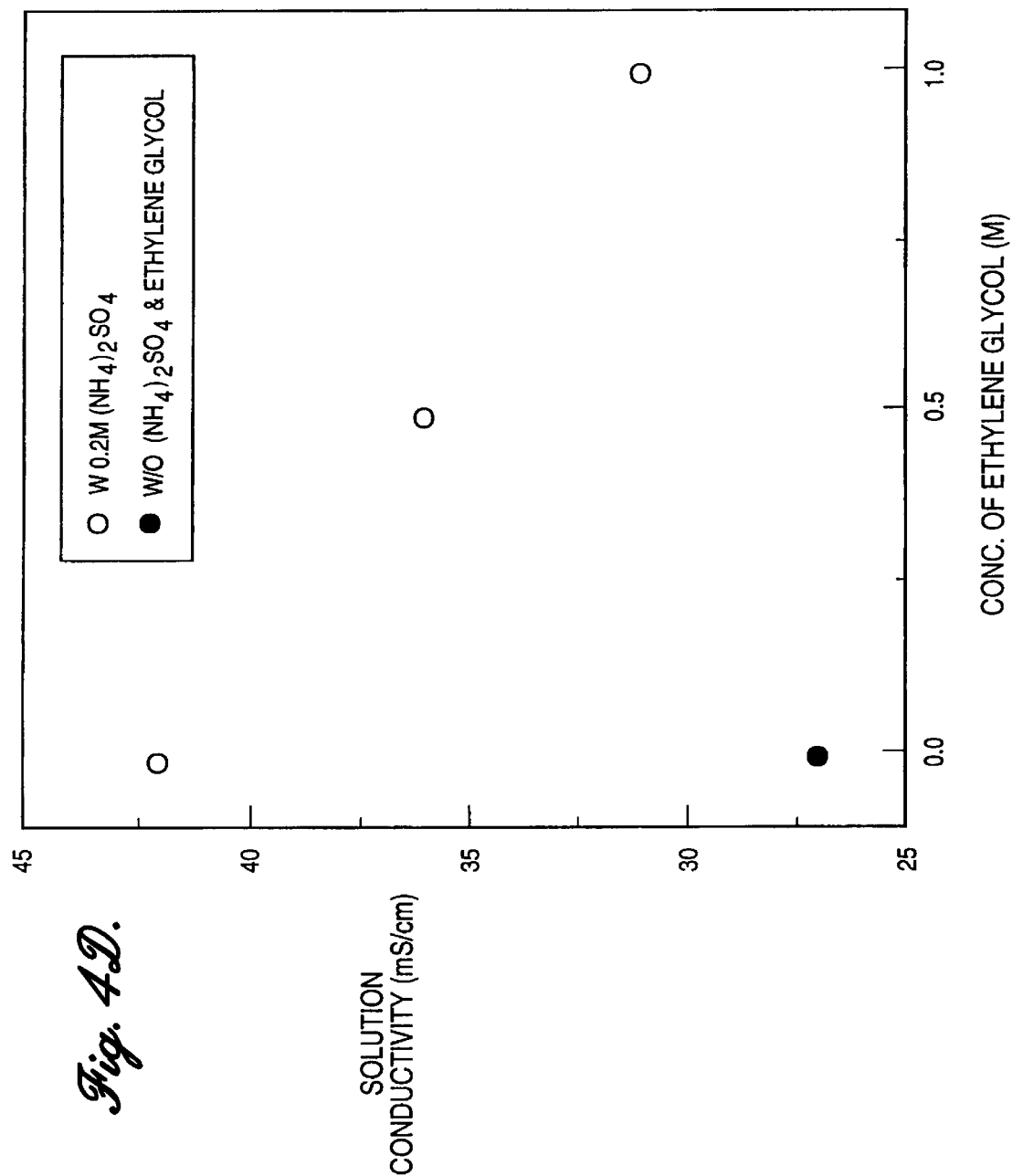

PATENT NO. : 6,197,181 B1 Page 1 of 1
DATED : March 6, 2001
INVENTOR(S) : L.L. Chen It is certified that error appears in the above-identified patent and that said Letters Patent is hereby corrected as shown below:

Drawings,
Sheet 5, delete "Fig. 4C.";
Sheet 6, delete "Fig. 4D.";

Column 5,
Line 25, "collect" should be -- connect --;

Column 6,
Line 2, "milliamps/cm" should be -- milliamps/cm$^2$ --;
Line 57, delete "is";

Signed and Sealed this

Third Day of December, 2002

JAMES E. ROGAN
*Director of the United States Patent and Trademark Office*

UNITED STATES PATENT AND TRADEMARK OFFICE
Certificate

Patent No. 6,197,181 B1

Patented: March 6, 2001

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: LinLin Chen, Plano, TX; and Thomas Taylor, Portland, OR.

Signed and Sealed this Second Day of December 2003.

ROY KING
*Supervisory Patent Examiner*
*Art Unit 1742*

UNITED STATES PATENT AND TRADEMARK OFFICE
CERTIFICATE OF CORRECTION

PATENT NO. : 6,197,181 B1  
DATED : March 6, 2001  
INVENTOR(S) : Chen, Linlin

It is certified that error appears in the above-identified patent and that said Letters Patent is hereby corrected as shown below:

<u>Title page,</u>
Item [75], Inventors, please insert the following: -- Thomas Taylor --.

Signed and Sealed this

Twenty-third Day of November, 2004

JON W. DUDAS
*Director of the United States Patent and Trademark Office*